US011005418B2

(12) United States Patent
Gastaldo

(10) Patent No.: US 11,005,418 B2
(45) Date of Patent: May 11, 2021

(54) DEVICE FOR TESTING A CONCENTRATED PHOTOVOLTAIC MODULE

(71) Applicant: Saint-Augustin Canada Electric Inc., Saint-Augustin de Desmaures (CA)

(72) Inventor: Philippe Gastaldo, Pontcharra (FR)

(73) Assignee: Saint-Augustin Canada Electric Inc., Saint-Augustin de Desmaures (CA)

( * ) Notice: Subject to any disclaimer, the term of this patent is extended or adjusted under 35 U.S.C. 154(b) by 1159 days.

(21) Appl. No.: 15/036,036

(22) PCT Filed: Nov. 14, 2014

(86) PCT No.: PCT/EP2014/074635
§ 371 (c)(1),
(2) Date: Aug. 14, 2016

(87) PCT Pub. No.: WO2015/071425
PCT Pub. Date: May 21, 2015

(65) Prior Publication Data
US 2016/0365834 A1 Dec. 15, 2016

(30) Foreign Application Priority Data
Nov. 14, 2013 (FR) ...................................... 1361142

(51) Int. Cl.
*H02S 50/15* (2014.01)
*H02S 40/22* (2014.01)
(Continued)

(52) U.S. Cl.
CPC .......... *H02S 50/15* (2014.12); *H01L 31/0547* (2014.12); *H02S 40/22* (2014.12);
(Continued)

(58) Field of Classification Search
CPC .... H02S 50/00–15; H02S 40/00; H02S 40/20; H02S 40/22; H01L 31/02021;
(Continued)

(56) References Cited

U.S. PATENT DOCUMENTS 3,877,814 A    4/1975  Hess et al.
6,076,942 A *  6/2000  Brandt .................... F21V 11/14
                                                      362/279
(Continued)

FOREIGN PATENT DOCUMENTS

CN        1316613 A      10/2001
CN      101290340 A      10/2008
(Continued)

OTHER PUBLICATIONS

International Search Report for International Application No. PCT/EP2014/07463 dated Jan. 14, 2015, 2 pages.
(Continued)

Primary Examiner — Huy Q Phan
Assistant Examiner — David B Frederiksen
(74) Attorney, Agent, or Firm — TraskBritt

(57) ABSTRACT

The invention relates to a device for testing a concentrated photovoltaic module comprising at least one assembly of a photovoltaic cell and of a concentrator, the device being characterized in that it comprises: a light source; a parabolic mirror coupled to the source so as to reflect the light emitted by the source in an almost collimated light beam toward the module to be tested, in a direction perpendicular to the surface of the module; and an intensity filter interposed on the path of the almost collimated beam upstream of the module to be tested, the filter comprising at least partially absorbent regions that have a neutral spectral density with respect to the light beam, the at least partially absorbent regions being arranged facing higher intensity zones of the
(Continued)

beam, so as to attenuate differences in the intensity of the beam.

17 Claims, 4 Drawing Sheets

(51) Int. Cl.
  *H02S 50/00* (2014.01)
  *H01L 31/054* (2014.01)
  *H02S 50/10* (2014.01)
(52) U.S. Cl.
  CPC .............. *H02S 50/00* (2013.01); *H02S 50/10* (2014.12); *Y02E 10/52* (2013.01)
(58) Field of Classification Search
  CPC .............. H01L 31/052; H01L 31/0521; H01L 31/0543; H01L 31/0547; H01L 31/056; H01L 31/0687
  See application file for complete search history.

(56) References Cited

U.S. PATENT DOCUMENTS

| | | | |
|---|---|---|---|
| 8,471,142 B1* | 6/2013 | Yu | H01L 31/0547 136/246 |
| 8,860,424 B1* | 10/2014 | Lamarche | H02S 50/10 324/501 |
| 2008/0048102 A1* | 2/2008 | Kurtz | H01L 31/02325 250/226 |
| 2009/0194098 A1 | 8/2009 | Placer | |
| 2010/0006139 A1* | 1/2010 | Zahuranec | G01M 11/005 136/246 |
| 2010/0046229 A1* | 2/2010 | Kwo | F21S 8/006 362/263 |
| 2010/0073011 A1* | 3/2010 | Svidenko | G01J 1/02 324/537 |
| 2011/0017269 A1* | 1/2011 | Fangman | F24S 23/80 136/246 |
| 2011/0246109 A1* | 10/2011 | Fafard | H02S 50/10 702/64 |
| 2011/0259396 A1* | 10/2011 | Hoffman | H01L 31/052 136/246 |
| 2011/0273020 A1 | 11/2011 | Balachandreswaran et al. | |
| 2012/0097546 A1* | 4/2012 | Kabagambe | C09D 5/24 205/116 |
| 2012/0223733 A1* | 9/2012 | Gunawan | F21V 9/40 324/761.01 |
| 2012/0273041 A1* | 11/2012 | Wu | G02B 5/0833 136/259 |
| 2013/0021054 A1* | 1/2013 | Voltan | G01R 31/26 324/761.01 |
| 2015/0015297 A1* | 1/2015 | Nakanishi | H02S 50/10 324/761.01 |
| 2016/0344340 A1 | 11/2016 | Blanchard et al. | |

FOREIGN PATENT DOCUMENTS

| | | |
|---|---|---|
| CN | 101351715 A | 1/2009 |
| CN | 101681948 A | 3/2010 |
| CN | 102252826 A | 11/2011 |
| CN | 103064030 A | 4/2013 |
| CN | 102160189 B | 3/2014 |
| CN | 102721841 B | 10/2014 |
| CN | 106471388 A | 3/2017 |
| JP | 2010186890 A | 8/2010 |
| TW | 201100693 A | 1/2011 |
| WO | 2010003115 A1 | 1/2010 |

OTHER PUBLICATIONS

International Written Opinion for International Application No. PCT/EP2014/07463 dated Jan. 14, 2015, 5 pages.
Chinese Supplementary Search Report for Chinese Application No. 201480072563, dated Mar. 6, 2019, 1 page.
Chinese First Search Report for Chinese Application No. 201480072563, dated Aug. 7, 2018, 2 pages.
Chinese First Search for Chinese Application No. 201480072325, dated Jul. 18, 2018, 2 pages.
Chinese First Office Action for Chinese Application No. 201480072563, dated Aug. 28, 2018, 22 pages with English Translation.
Chinese First Office Action for Chinese Application No. 201480072325, dated Jul. 27, 2018, 9 pages with English Translation.

* cited by examiner

DEVICE FOR TESTING A CONCENTRATED PHOTOVOLTAIC MODULE

CROSS-REFERENCE TO RELATED APPLICATIONS

This application is a national phase entry under 35 U.S.C. § 371 of International Patent Application PCT/EP2014/074635, filed Nov. 14, 2014, designating the United States of America and published as International Patent Publication WO 2015/071425 A1 on May 21, 2015, which claims the benefit under Article 8 of the Patent Cooperation Treaty to French Patent Application Serial No. 1361142, filed Nov. 14, 2013. The subject matter of this application is also related to the subject matter of U.S. patent application Ser. No. 15/036,030, filed May 11, 2016 and entitled "Method for Testing a Concentrated Photovoltaic Module."

TECHNICAL FIELD

This disclosure relates to a device and a method for testing a concentration photovoltaic module.

BACKGROUND

A concentration photovoltaic module (CPV) essentially comprises a photovoltaic cell (for example multi-junction) and a concentrator designed to concentrate solar radiation toward the cell.

In the case of a multi junction cell, the different junctions are arranged in series, each of the junctions being adapted to a specific spectral band of the sunlight.

Multi-junction cells, which are a smaller size than conventional solar cells made of silicon, have the advantage of offering better efficiency, but to function need a higher light intensity.

In a CPV module the cells are associated with a concentrator, for example a Fresnel lens, which concentrates solar radiation toward the cell.

Also, photovoltaic modules are designed to be mounted on a sun-follower system (also called "tracker") so as to optimally orient the module as a function of the trajectory of the sun so that the concentrators focus the rays of the sun onto the cells.

During manufacture of such photovoltaic modules it is usual to verify the operation and performance of each module, with a view to detecting any failure of any one of the junctions, defects in quality or positioning of concentrators, or any other anomaly of the module before it is expedited.

The modules are frequently combined by being mounted totally or partially in series. In this case, performance of the overall system will be limited by the weakest element. It can therefore prove useful to select the modules before they are combined so that they are homogeneous in response. In this respect, it is important to be able to measure the performance of this module.

For this purpose, it is known to simulate the lighting of the sun by means of a lighting device generally called a "flasher," which generates a light beam having irradiance, spectral power distribution and angular divergence close to those of the sun. These characteristics are to be conformed over the entire surface of the module to be tested.

CPV modules currently commercially available have relatively small dimensions (of the order of 0.5 to 1.5 $m^2$). There are lighting devices which simulate solar lighting on a module of this type.

The Soitec company has marketed large-size solar modules, having a surface of several $m^2$, comprising several CPV sub-modules connected by a single chassis.

So for example, a module of 8 $m^2$ can be formed by two rows of six sub-modules, which can optionally be connected in series.

There is therefore the problem of being able to test a large-size module. In fact, since the sub-modules are connected totally or partially in series and their mechanical integrity is assured by a single chassis, they cannot be tested independently.

On the other hand, it is important to ensure the operation of the assembly before it is installed.

It is therefore necessary to be able to verify the performance of the complete module by simulating lighting the closest possible to solar radiation.

In this respect, the constraints the lighting device must respect are the following:

irradiance comparable to that produced by the sun at ground level, that is, of the order of 1 $kW/m^2$.

reproduction of the complete solar spectrum, from ultraviolet to infrared, by respecting spectral densities, angular divergence close to that of solar light, that is, 0.5° (±0.25°), considerable spatial uniformity of the irradiance (the aim being inhomogeneity of irradiance less than or equal to 5%).

Known lighting devices do not respond to these demands for a large-size module.

In fact, these devices offer either a more reduced field or characteristics (especially angular divergence) too far removed from those of the sun.

Another constraint to be considered in designing the lighting device is the compactness of the test installation.

So, it is not feasible to place a light source far from the module to obtain low angular divergence because, given the surface of the module, this would imply a distance of several tens of meters, not compatible with an industrial installation.

Retaining the compactness of the test device requires the use of a plurality of mirrors.

But this brings up an economic problem linked to the cost of parabolic mirrors.

In fact, to the extent where surface defects of the parabolic mirror of the lighting device are likely to affect the homogeneity of the light intensity sent to the module, very high-quality mirrors are generally used, such as mirrors employed in astronomy.

These mirrors are very expensive.

For known devices using just a single mirror, this cost is acceptable.

However, it would be economically very penalizing to use a plurality of such mirrors in the planned test device.

It is also possible to make a mirror by molding or thermoforming a plate of plastic material then depositing a reflecting film on it.

However, the surface state obtained by this technique is unsatisfactory.

Even if surface defects of minimal amplitude are present on the mirror, due to the distance between the mirror and the module to be tested they can engender a substantial variation in light intensity arriving at the module.

It is therefore necessary to find a solution to procure the expected homogeneity for the light intensity delivered by the source, less expensive than existing techniques.

An aim of the present disclosure is to provide a device for testing a concentration photovoltaic module of large size, which respects the abovementioned restrictions and which offers especially very good homogeneity of light intensity and which has a cost less than that of existing devices.

BRIEF SUMMARY

As per the present disclosure, a device for testing a concentration photovoltaic module is proposed comprising at least one assembly of a photovoltaic cell and a concentrator arranged relative to the cell to concentrate radiation arriving at normal incidence to the cell, the device being characterized in that it comprises:

- at least one light source,
- at least one parabolic mirror coupled to the source so as to send back the light coming from the source in an almost collimated light beam to the module to be tested, in a direction perpendicular to the surface of the module, and
- an intensity filter interposed on the trajectory of the almost collimated beam upstream of the module to be tested, the filter comprising at least partially absorbent regions with neutral spectral density relative to the light beam, the at least partially absorbent regions being arranged facing areas of greatest intensity of the beam so as to attenuate the differences in intensity of the beam.

Almost collimated beam in the present text means a beam wherein the divergence is low, typically less than 1°. In this disclosure, to reproduce the divergence of the sun, the almost collimated beam may have a divergence of +/−0.25°.

As is known per se, each almost collimated beam is obtained by placing the orifice of each light source at the focal point or in the vicinity of the focal point of the parabolic mirror to which it is coupled, the skilled person being capable of defining the dimensional characteristics of the orifice and of the source-mirror couple to obtain such an almost collimated beam.

Even though the present disclosure is particularly advantageous for a large-sized module comprising a plurality of sub-modules, the device described hereinabove also has a notable advantage for testing a unitary module of reduced dimensions, to the extent where the intensity filter is a cheaper solution than the very high-quality mirrors known to ensure uniform distribution of the intensity of the light beam.

According to an embodiment, the intensity filter comprises a support transparent to the almost collimated beam and a film adhered on the support, the film comprising at least partially absorbent regions with neutral spectral density relative to the almost collimated beam, the at least partially absorbent regions corresponding to the areas of greatest intensity of the beam.

Alternatively, the intensity filter comprises a support transparent to the almost collimated beam, the support comprising a printing layer comprising at least partially absorbent regions with neutral spectral density relative to the almost collimated beam, the at least partially absorbent regions corresponding to the areas of greatest intensity of the beam.

The at least partially absorbent regions of the filter advantageously consist of elementary patterns, the patterns comprising patterns transparent and patterns opaque to the light beam.

According to a particular embodiment, the elementary patterns have a square or rectangular shape.

The parabolic mirror can advantageously comprise a glass plate covered with a reflecting film or a stack of thin reflecting layers.

According to a preferred embodiment, the test device is adapted to test a concentration photovoltaic module comprising a plurality of photovoltaic sub-modules each comprising at least one assembly of a photovoltaic cell and a concentrator.

In this case, the device comprises a plurality of light sources and a plurality of parabolic mirrors coupled to the sources so as to send almost collimated beams to the module to be tested and an intensity filter is interposed on the trajectory of each almost collimated beam upstream of the module to be tested, each intensity filter comprising at least partially absorbent regions with neutral spectral density relative to the light beam, the at least partially absorbent regions being arranged facing the areas of greatest intensity of the beam so as to attenuate the differences in intensity of each beam.

The device can further comprise a support for the module to be tested, the light sources being arranged according to two rows extending on both sides of the placement of the module on the support.

The parabolic mirrors are preferably arranged so as to form two horizontal rows facing the support of the module to be tested.

Another aim relates to a method for testing a concentration photovoltaic module, the module comprising at least one assembly of a photovoltaic cell and a concentrator arranged relative to the cell to concentrate to the cell radiation arriving at normal incidence, the method being characterized in that at least one almost collimated light beam is sent to the module by means of at least one light source coupled to a parabolic mirror, and in that, an intensity filter comprising at least partially absorbent regions with neutral spectral density relative to the light beam is interposed on the trajectory of the almost collimated light beam upstream of the module to be tested, the at least partially absorbent regions being arranged facing the areas of greatest intensity of the beam, so as to attenuate the differences in intensity of the beam.

According to an embodiment, the intensity filter is formed by adhering, on a support transparent to the almost collimated beam, a film comprising at least partially absorbent regions relative to the almost collimated beam, the at least partially absorbent regions corresponding to the areas of greatest intensity of the beam.

According to another embodiment, the intensity filter is formed by printing, on a support transparent to the almost collimated beam, at least partially absorbent regions with neutral spectral density relative to the almost collimated beam, the at least partially absorbent regions corresponding to the areas of greatest intensity of the beam.

The parabolic mirror is advantageously formed by thermoforming a glass or plastic plate then covering it with a reflecting film or a stack of reflecting thin layers.

According to a preferred embodiment of the present disclosure, the photovoltaic module to be tested comprises a plurality of photovoltaic sub-modules and a plurality of almost collimated light beams is sent to the module by means of a plurality of light sources coupled to a plurality of parabolic mirrors; an intensity filter comprising at least partially absorbent regions with zero spectral density relative to the light beam is interposed on the trajectory of each almost collimated light beam upstream of the module to be tested, the at least partially absorbent regions being arranged facing the areas of greatest intensity of the beam so as to attenuate the differences in intensity of each beam.

As many light sources, parabolic mirrors and intensity filters as sub-modules of the photovoltaic module to be tested can be used, each light source and each parabolic mirror being coupled so as to send an almost collimated light beam to a corresponding sub-module.

According to a particular embodiment, the surface of the module to be tested is greater than or equal to 8 m².

As is particularly advantageous, the at least partially absorbent regions of the intensity filter are defined by implementing the following steps:

acquisition of an image of the almost collimated beam originating from the parabolic mirror, determination, on the image, of the areas of the beam of greatest intensity, decomposition of the areas of the image into elementary patterns, attribution to each elementary pattern of a transparent or opaque character relative to the light flow so as to faun, facing the areas of greatest intensity of the light beam, at least partially absorbent regions consisting of the patterns.

BRIEF DESCRIPTION OF THE DRAWINGS

Other characteristics and advantages of the disclosure will emerge from the following detailed description in reference to the appended drawings, in which.

DETAILED DESCRIPTION

Figure 1A:
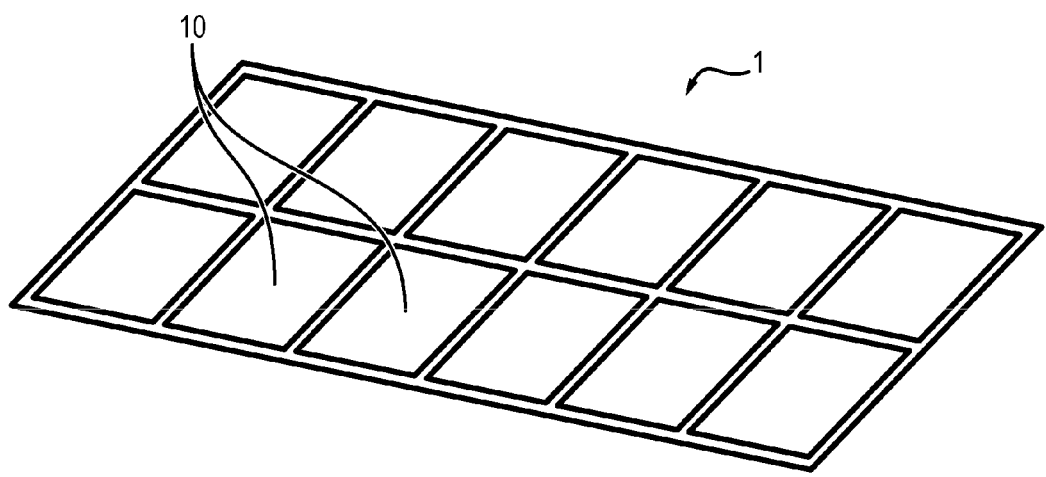
FIG. 1A is a schematic diagram of a concentration photovoltaic module comprising several sub-modules connected in series.

FIG. 1A is a schematic diagram of a photovoltaic module that may be tested using embodiments of the present disclosure.

The module 1 to be tested comprises a plurality of concentration sub-photovoltaic modules 10.

Each sub-photovoltaic module 10 comprises a plurality of cell—concentrator assemblies.

Figure 1B:
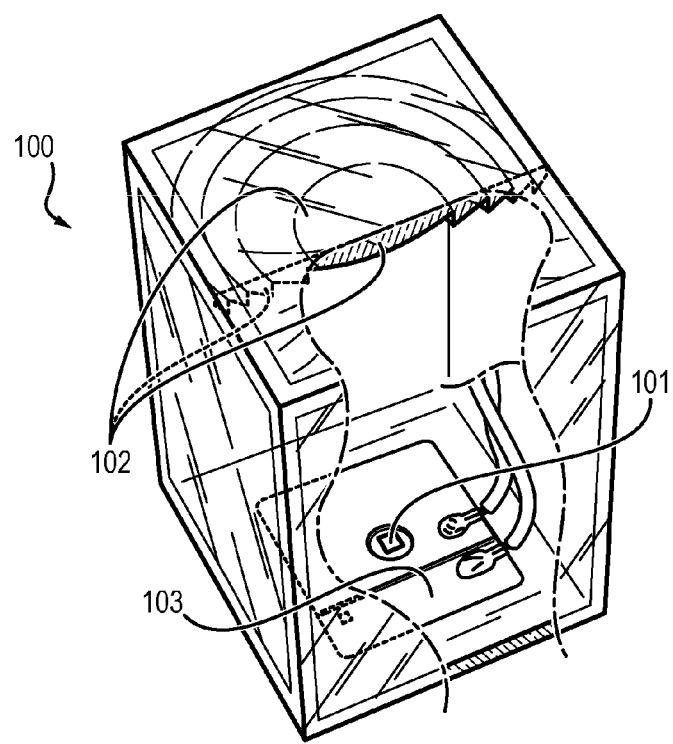
FIG. 1B is a schematic diagram of a photovoltaic cell—concentrator assembly belonging to a sub-module of such a module.

As illustrated in FIG. 1B, each assembly 100 essentially comprises a photovoltaic cell 101 (for example multi-junction) and a concentrator 102 designed to concentrate the solar radiation arriving in normal incidence toward the photovoltaic cell 101. Optionally, the photovoltaic cell 101 is placed on a heat dissipator 103 to limit its rise in temperature.

The concentrator 102 comprises for example a Fresnel lens.

In the present text the surface of the module to be tested is the surface of the concentrators.

The sub-photovoltaic modules 10 forming the module 1 can optionally be electrically connected in series or in parallel.

The surface of each sub-module 10 has a generally rectangular shape, whereof the width and height are respectively in the following ranges: between 30 and 80 cm in width, for example 60 cm, and between 60 and 150 cm in height, for example 120 cm.

The sub-photovoltaic modules 10 are typically arranged in the shape of rows and/or columns to form the module.

For example, a module of 8 m² can be formed from two rows of six sub-modules, each sub-module having a surface of around 0.7 m².

Figure 2:
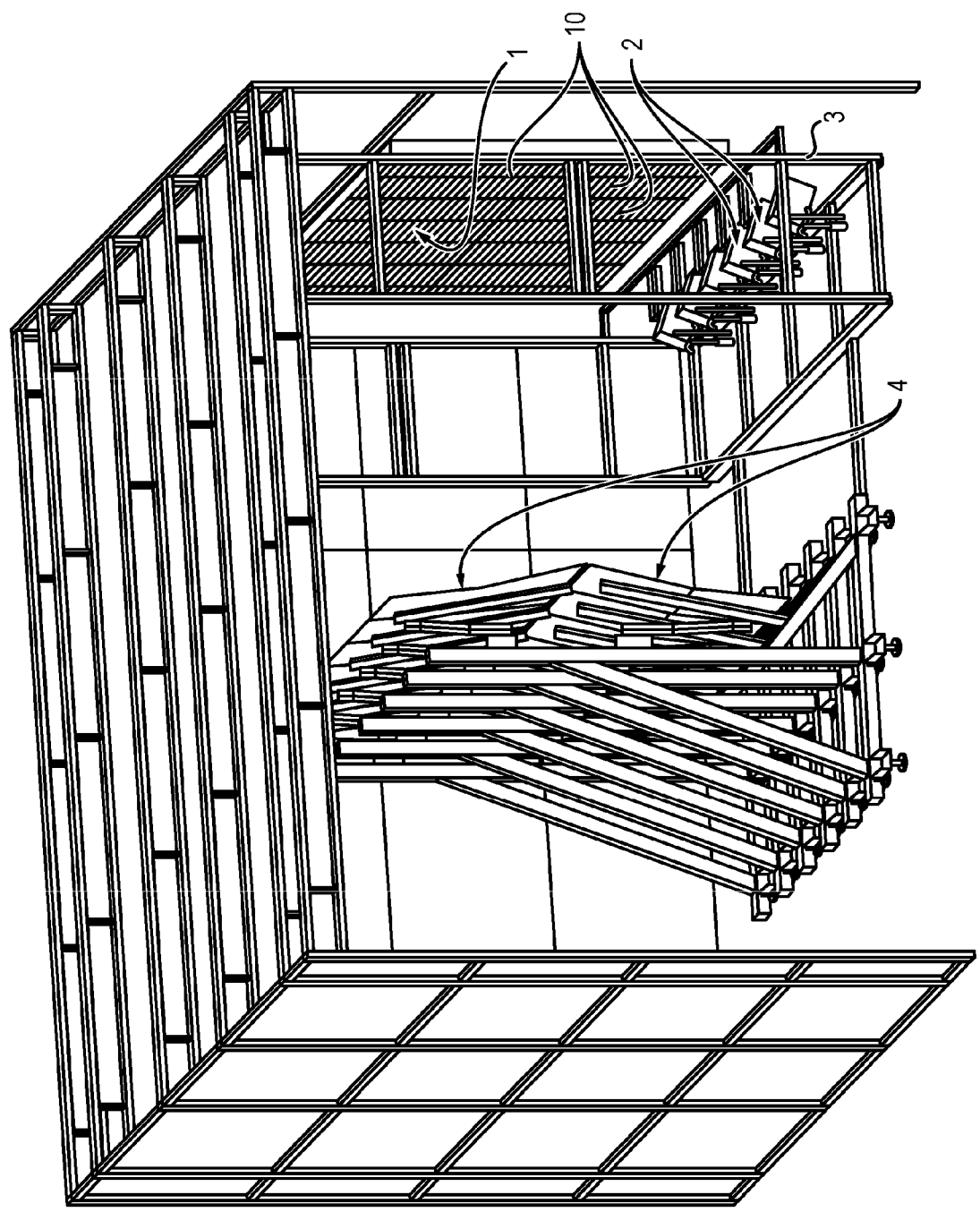
FIG. 2 is an overview of a test device according to an embodiment the present disclosure.

FIG. 2 is an overview of a test device according to the present disclosure.

The device comprises a support 3 for the module 1 to be tested.

Preferably, the support 3 is arranged such that the surface of the module to be tested is vertical.

"Vertical" in the present text means a direction perpendicular to the floor of the building in which the test device is installed.

In front of the support 3 the test device comprises a plurality of light sources 2 and a plurality of parabolic mirrors 4 coupled to the light sources so as to reflect the light originating from each source in an almost collimated light beam in a direction perpendicular to the surface of the module.

According to a preferred embodiment, each source is arranged at the focal point of the corresponding parabolic mirror.

In this case, the test device therefore comprises as many sources as mirrors.

This utilises a plurality of identical mirrors, whereof the position and orientation are adjusted so as to send back towards the module to be tested an almost collimated beam perpendicular to the surface of the module.

According to another embodiment, each light source can be coupled to several mirrors, to the extent where these mirrors are arranged such that their focal points coincide, the source being arranged at the placement of these focal points.

In the embodiment illustrated in FIG. 2, where the module 1 comprises two horizontal rows of six sub-photovoltaic modules 10, the test device comprises twelve light sources 2 placed according to two horizontal rows on either side of the module 1, and twelve parabolic mirrors 4 placed according to two horizontal rows facing the module 1.

Each source and the corresponding parabolic mirror are oriented relative to each other such that the light beam sent back by the mirror is perpendicular to the surface of the corresponding sub-module.

The distance between the sources and the parabolic mirrors is defined such that the almost collimated light beam sent back by each mirror illuminates with the preferred characteristics the entire surface of the corresponding sub-module.

This distance, as well as the surface of the mirrors, therefore depends on the surface of the sub-modules of the module to be tested.

Without wanting to be limiting, it is considered that a distance of the order of 2 to 6 meters measured at the ground between the parabolic mirrors and the light sources—which determines the majority of the surface at the ground of the test device—is reasonable.

It is not indispensable for the number of light sources and parabolic mirrors to be identical to the number of sub-modules of the photovoltaic module to be tested.

In fact, if the surface of each sub-module is sufficiently low, it can eventuate that a light source—parabolic mirror couple illuminates several sub-modules and retains a ground space acceptable to the test device and a mirror size which does not impair its manufacturing cost.

On the other hand, there can be areas, at the border between adjacent almost collimated beams, in which the intensity fails to satisfy the criteria for uniformity or divergence.

In this case, the light sources and the parabolic mirrors are advantageously arranged so that areas not illuminated by the almost collimated beams sent by the mirrors coincide with the areas separating the sub-modules from the module to be tested, which are not functional in terms of photovoltaic conversion.

For reasons of assembly of the modules, as can be seen in FIG. 1A, there is in fact a space between two adjacent sub-photovoltaic modules 10, at which no photovoltaic conversion takes place.

In this way, if any defects in uniformity occur in these areas, these defects have no negative effect on the quality of the test.

To allow this adjustment, the test device is designed such that adjustment of the position and orientation of each mirror is possible.

Clearance is advantageously provided between the mirrors to enable such adjustments.

Figure 3:
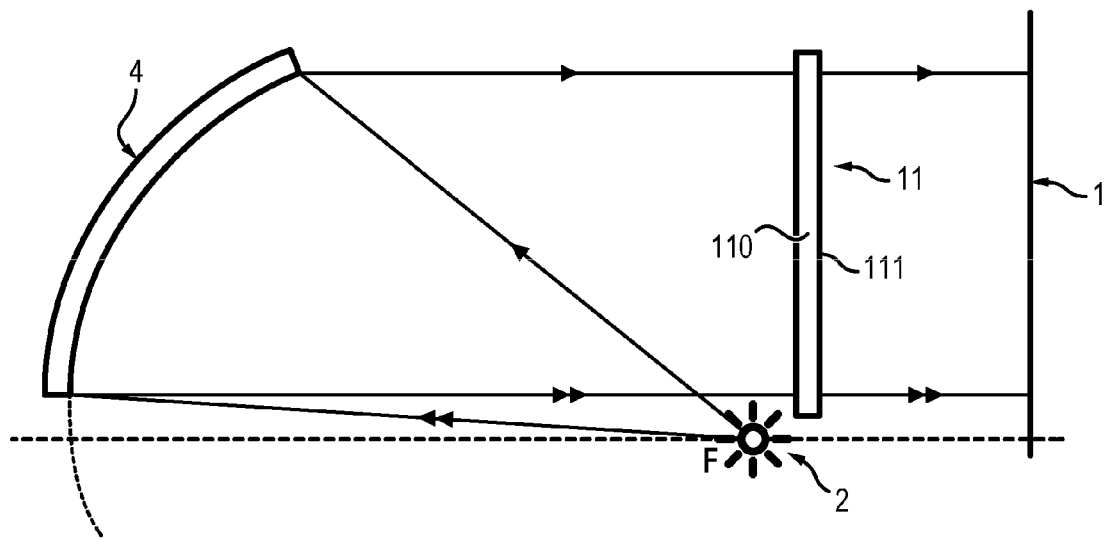
FIG. 3 is a schematic diagram of a light source, mirror and intensity filter assembly belonging to a test device according to the present disclosure.

As shown in FIG. 3, to compensate shape imperfections of a parabolic mirror 4 affecting the uniformity of the intensity of the almost collimated light beam, an intensity filter 11 is interposed on the trajectory of the beam, upstream of the module 1.

The intensity filter 11 comprises at least partially absorbent regions with neutral spectral density relative to the light beam.

"Absorbent with neutral spectral density" means that the region concerned of the filter blocks in intensity in an equivalent manner all the wavelengths of the light beam. In this case this is not selective absorption of a determined range of wavelengths.

The intensity filter 11 is specifically adapted to the mirror 4, i.e. the at least partially absorbent regions of the filter are arranged facing the areas of greatest intensity of the beam.

Optionally the intensity filter 11 can be specifically adapted to a mirror—light source couple, which compensates any defects in uniformity of the source apart from those of the mirror.

So, the at least partially absorbent regions diminish the intensity of the beam passing through them.

Other regions of the filter are transparent or less absorbent so as to transmit the entire light beam or a majority of the intensity of the latter in the areas of the beam exhibiting lower intensity.

In practice, distribution of the at least partially absorbent regions on the filter and the degree of absorption of the regions correspond substantially to the negative of distribution of the intensity of the light beam.

In this way, the filter attenuates the differences in intensity of the beam and produces improved uniformity of the intensity arriving at the module.

Implementing such a filter uses parabolic mirrors having a quality less than that of mirrors used in known flashers, substantially lowering the cost of the mirrors.

In particular, parabolic mirrors made by low-cost methods can be used, for example by thermoforming of a glass plate or plastic material followed by coating with a reflecting film or a stack of thin reflecting layers.

According to an embodiment, illustrated in FIG. 3, the intensity filter 11 comprises a support 110 transparent to the almost collimated beam and a film 111 adhered on the support 110, the film 111 comprising the absorbent regions mentioned above.

According to another embodiment, not shown here, the intensity filter comprises a support transparent to the almost collimated beam and a printing layer applied to the support to form the absorbent regions.

The support is planar so as not to deform the almost collimated beam and is positioned perpendicular to the beam.

As is particularly advantageous, the support is a glass plate.

Figure 4:
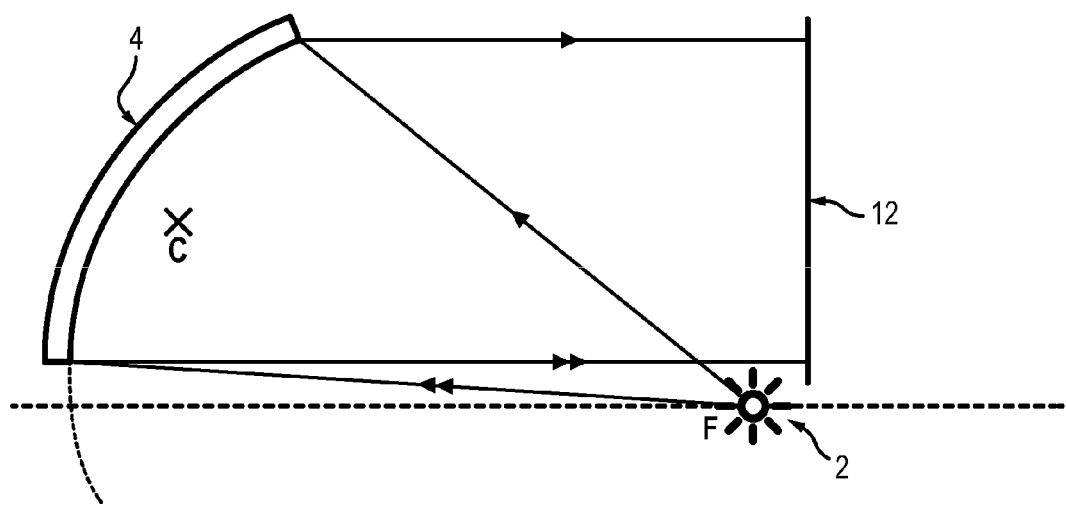
FIG. 4 is a schematic diagram of a device for defining the intensity filter to be interposed on the trajectory of the light beam.

FIG. 4 illustrates the arrangement of a device for defining an intensity filter adapted to a determined mirror.

The light source 2 is arranged at the focal point F of the mirror 4 so that the mirror 4 sends back the light emitted by the source in an almost collimated beam.

A screen 12 of uniform tint is placed on the trajectory of the beam, perpendicular to the latter.

An image sensor is placed at a placement C facing the screen 12, and an image of the beam projected onto the screen 12 is recorded.

Figure 5A:
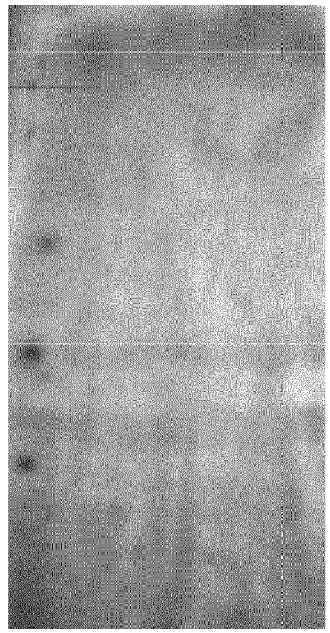
FIGS. 5A and 5B are images respectively of the light intensity produced by a light source—parabolic mirror assembly and the negative filter for compensating the effects of the surface defects of the mirror on the intensity of the light beam.

The result is mapping of the intensity of the beam, such as illustrated in FIG. 5A.

As is clear, the intensity of the beam is shown by levels of grey (the lightest areas having the strongest intensity) and is not uniform.

Figure 5B:
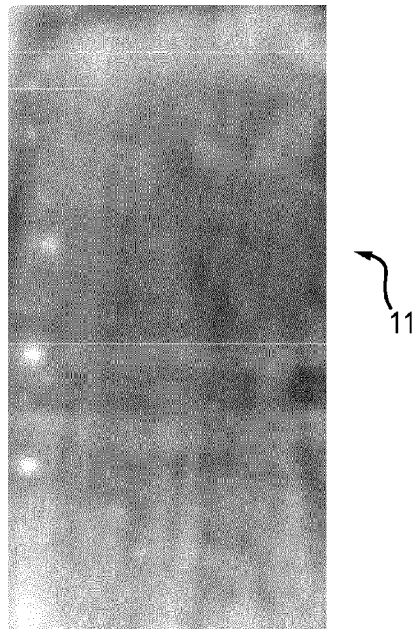

A negative of this image is created, illustrated in FIG. 5B, having more absorbent dark regions facing the light areas of the image of the light beam, and transparent or less absorbent light regions facing the dark areas of the image of the light beam.

It is this negative image which is used to form the intensity filter 11.

According to an embodiment, this negative image is printed on a film in turn applied to a support transparent to the light beam.

As is particularly advantageous, the film is a transparent self-adhesive film intended to be adhered on the support after printing.

Alternatively, the negative image is directly formed on a transparent support by a printing method.

As is particularly advantageous, before the filter is made, the negative image is transformed in to a binary set of elementary patterns comprising patterns 11a transparent and patterns 11b opaque to the light beam.

Figure 6:
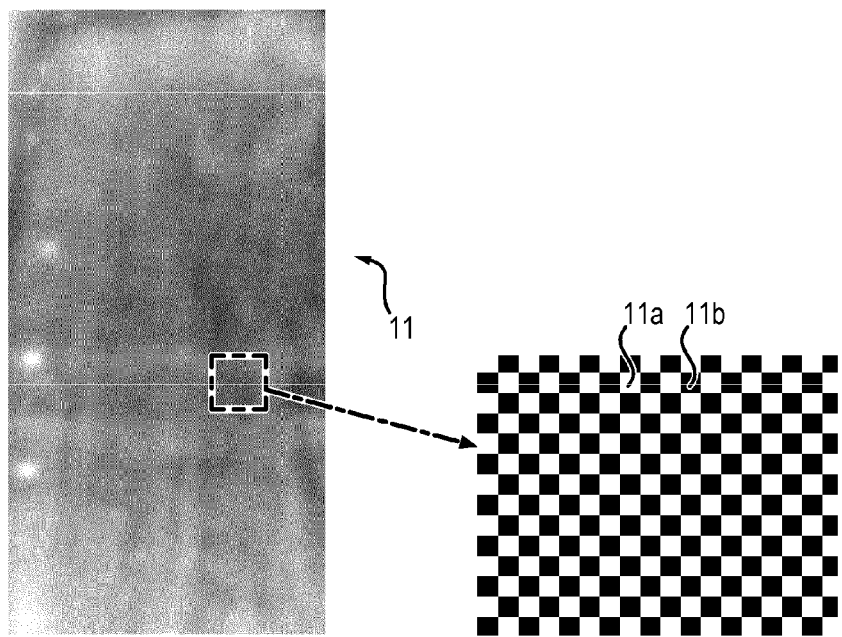
FIG. 6 shows an example of an at least partially absorbent region of the filter, comprising a set of transparent and opaque patterns.

In the example of FIG. 6, this shows in an enlarged manner a region of the filter in the shape of a checkerboard consisting of transparent squares 11a and absorbent black squares 11b.

Naturally, any other form of elementary patterns could be selected without as such departing from the scope of the present disclosure, the shape and dimension of the patterns further able to vary from one region to the other of the filter.

The degree of absorption of the filter relative to the light beam can in fact be modulated by the shape and dimension of the different patterns.

According to the region of the filter, patterns of different forms and/or dimensions could therefore be found to procure the preferred absorption.

By way purely of indication, for patterns of square form, the length of the side is between 0.5 and 10 mm.

This binarization of the negative image produces the filter simply by using black ink printing to form the elementary absorbent patterns.

In the case of the test of a large-sized module, a corresponding intensity filter is made for each parabolic mirror of the test device, and each filter is installed on the trajectory of the light beam sent back by the corresponding mirror.

The invention claimed is:

1. A device for testing a concentration photovoltaic module comprising a plurality of photovoltaic sub-modules, each sub-module of the plurality comprising at least one assembly of a photovoltaic cell and a concentrator arranged relative to the cell to concentrate to the cell radiation arriving at normal incidence, the device comprising:
    a plurality of light sources,
    a plurality of parabolic mirrors coupled to the light sources so as to send back the light coming from each light source in an-almost collimated light beams to the module to be tested, in a direction perpendicular to the surface of the module, and
    an intensity filter interposed on the trajectory of each almost collimated light beam upstream of the module to be tested, the intensity filter comprising at least partially absorbent regions with neutral spectral density relative to each light beam, the at least partially absorbent regions being arranged facing areas of greatest intensity of each light beam so as to attenuate the differences in intensity of each light beam and improve homogeneity of each light beam.

2. The device according to claim 1, wherein the intensity filter comprises a support transparent to each almost collimated light beam and a film adhered on the support, the film comprising at least partially absorbent regions with neutral spectral density relative to each almost collimated light beam, the at least partially absorbent regions corresponding to the areas of greatest intensity of each light beam.

3. The device according to claim 2, wherein the at least partially absorbent regions of the intensity filter consist of elementary patterns, the patterns comprising patterns transparent and patterns opaque to each light beam.

4. The device according to claim 3, wherein the elementary patterns have a square or rectangular shape.

5. The device according to claim 1, wherein the intensity filter comprises a support transparent to each almost collimated light beam, the support comprising a printing layer comprising at least partially absorbent regions with neutral spectral density relative to each almost collimated light beam, the at least partially absorbent regions corresponding to the areas of greatest intensity of each light beam.

6. The device according to claim 5, wherein the at least partially absorbent regions of the intensity filter consist of elementary patterns, the patterns comprising patterns transparent and patterns opaque to each light beam.

7. The device according to claim 4, wherein the elementary patterns have a square or rectangular shape.

8. The device according to claim 1, wherein the parabolic mirror comprises a glass or plastic plate covered with a reflecting film or a stack of reflecting thin layers.

9. The device according to claim 1, further comprising a support for the module to be tested, and wherein the light sources of the plurality are arranged in two rows extending on both sides of the module on the support.

10. The device according to claim 9, wherein the parabolic mirrors are arranged so as to form two horizontal rows facing the support of the module to be tested.

11. A method for testing a concentration photovoltaic module, the module comprising a plurality of photovoltaic sub-modules, each sub-module of the plurality comprising at least one assembly of a photovoltaic cell and a concentrator arranged relative to the cell to concentrate to the cell radiation arriving at normal incidence, wherein a plurality of almost collimated light beams are sent to the module by a plurality of light sources coupled respectively to a plurality of parabolic mirrors, and wherein an intensity filter comprising at least partially absorbent regions with neutral spectral density relative to the light beams is interposed on the trajectory of each almost collimated light beam upstream of the module to be tested, the at least partially absorbent regions being arranged facing the areas of greatest intensity of each beam so as to attenuate the differences in intensity of each beam and improve homogeneity of each light beam.

12. The method according to claim 11, wherein the intensity filter is formed by adhering, on a support transparent to each almost collimated light beam, a film comprising at least partially absorbent regions relative to each almost collimated light beam, the at least partially absorbent regions corresponding to the areas of greatest intensity of each light beam.

13. The method according to claim 11, wherein the intensity filter is formed by printing, on a support transparent to each almost collimated light beam, at least partially absorbent regions with neutral spectral density relative to each almost collimated light beam, the at least partially absorbent regions corresponding to the areas of greatest intensity of each beam.

14. The method according to claim 11, wherein the parabolic mirror is formed by thermoforming a glass plate and then covering the glass plate with a reflecting film or a stack of reflecting thin layers.

15. The method according to claim 11, wherein as many light sources, parabolic mirrors and intensity filters are used as sub-modules of the concentration photovoltaic module to be tested, each light source and each parabolic mirror being coupled so as to send an almost collimated light beam to a corresponding sub-module.

16. The method according to claim 11, wherein the surface of the module to be tested is greater than or equal to 8 $m^2$.

17. The method according to claim 11, wherein the at least partially absorbent regions of the intensity filter are defined by implementing the following steps:
    acquisition of an image of each almost collimated light beam originating from the parabolic mirror,
    determination, on the image, of the areas of the light beams of greatest intensity, decomposition of the areas of the image into elementary patterns,
    attribution to each elementary pattern of a transparent or opaque character relative to light flow so as to form, facing the areas of greatest intensity of each light beam, at least partially absorbent regions consisting of the patterns.

* * * * *

UNITED STATES PATENT AND TRADEMARK OFFICE
CERTIFICATE OF CORRECTION

Page 1 of 1

PATENT NO. : 11,005,418 B2
APPLICATION NO. : 15/036036
DATED : May 11, 2021
INVENTOR(S) : Philippe Gastaldo It is certified that error appears in the above-identified patent and that said Letters Patent is hereby corrected as shown below:

In the Specification
Column 5, Line 17, change "faun" to --form--

In the Claims
Column 9, Line 20, change "an-almost" to --almost--

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*